United States Patent [19]

Shih et al.

[11] Patent Number: 4,592,308
[45] Date of Patent: Jun. 3, 1986

[54] SOLDERLESS MBE SYSTEM

[75] Inventors: Hung-Dah Shih, Plano; Tommy J. Bennett, McKinney, both of Tex.

[73] Assignee: Texas Instruments Incorporated, Dallas, Tex.

[21] Appl. No.: 643,894

[22] Filed: Aug. 23, 1984

Related U.S. Application Data

[63] Continuation-in-part of Ser. No. 550,654, Nov. 10, 1983, abandoned.

[51] Int. Cl.$^4$ ............................................. C23C 14/50
[52] U.S. Cl. ................................... 118/726; 118/729; 118/500; 118/728; 156/DIG. 103
[58] Field of Search ............... 118/728, 729, 730, 731, 118/500, 726; 156/610, 614, DIG. 103, 611, 613; 269/287, 903; 432/253, 258; 211/40, 41; 206/309, 328, 444, 453, 488; 315/99111, 81; 350/318, 587; 414/217

[56] References Cited

U.S. PATENT DOCUMENTS

| | | | |
|---|---|---|---|
| 4,201,152 | 5/1980 | Luscher | 118/729 |
| 4,274,476 | 6/1981 | Garrett | 165/80 E |
| 4,365,588 | 12/1982 | Jolly | 118/729 X |

FOREIGN PATENT DOCUMENTS 1903315  11/1982  Japan .

Primary Examiner—Bernard F. Plantz
Attorney, Agent, or Firm—Carlton H. Hoel; Robert O. Groover; James T. Comfort

[57] ABSTRACT

A molecular beam epitaxy system wherein the wafer on which epitaxial deposition is to occur is not soldered to a substrate holder. Instead, a substrate holder with a lip approximately as high as the thickness of the wafer is used, and a retaining ring attaches to the substrate holder to hold the wafer in place during the growth cycle. The retaining ring, like the substrate holder, is made of high-purity refractory material, such as arccast molybdenum. The substrate holder and retaining ring are dimensioned to hold the wafer somewhat loosely, to allow for thermal expansion during the cycling up to growth temperature, which is typically about 600° C.

5 Claims, 7 Drawing Figures

SOLDERLESS MBE SYSTEM

RELATED APPLICATION

This is a continuation in part of application Ser. No. 550,654, filed Nov. 10, 1983, now abandoned.

BACKGROUND AND SUMMARY OF THE INVENTION

The present invention relates to molecular beam epitaxy (MBE) systems.

In molecular beam epitaxy, thin film deposition is achieved by directing molecular beams onto a substrate in an ultra high vacuum. Preferably the beams are not ionized, but are neutral molecular or atomic species, whence the name of the process. The substrate is heated to a temperature where kT is large enough to permit a deposited atom to move laterally for an average distance of at least several angstroms, to permit the deposited atoms to find their energetically preferred sites. Thus, MBE permits growth of thin films with extremely high crystalline quality. The MBE technique is generally well known, and has been widely discussed. See, for example, the following review articles, which are hereby incorporated by reference: A. Y. Cho and J. R. Arthur, in *Progress in Solid State Chemistry*, edited by J. McCaldin and G. Somorjai (Pergamon, New York, 1975), Vol. 10, p. 157; L. L. Chang, in *Handbook on Semiconductors*, edited by S. P. Keller (North-Holland, Amsterdam, 1980), Vol. 3 Chapter 9; C. E. C. Wood, in *Physics of Thin Films*, edited by C. Haff and M. Frankcombe (Academic, New York, 1980), Vol. 11, p. 35; C. T. Foxon and B. A. Joyce, in *Current Topics in Materials Science*, edited by E. Kaldis (North-Holland, Amsterdam, 1981), Vol. 7, Chapter 1.

Molecular beam epitaxy is very attractive as a product technology for many applications, due to its unique capabilities. MBE easily produces hetero-epitaxial structures, wherein an epitaxial layer of one material is epitaxially deposited onto an underlying layer of a different material. The abrupt epitaxial transitions which can thus be achieved can be rapidly alternated to achieve superlattice structures, wherein, as the different epitaxial layers become very thin, some anomalous and highly desirable properties appear. Such structures are very difficult to make in any other way. MBE can also be used to make strained superlattices, wherein materials which are not lattice-matched in isolation are nevertheless grown in a perfect epitaxial structure. That is, materials which have the same crystal structure, but which would not have the same lattice spacing normally, can not be grown epitaxially by conventional methods. For example, the lattice constant of $InAs_{0.4}Sb_{0.6}$ is 0.4% less than that of $InAs_{0.27}Sb_{0.73}$. Thus, if one attempts to grow an epitaxial layer of $In\ As_{0.4}Sb_{0.6}$ on a $In\ As_{0.27}Sb_{0.73}$ substrate by conventional methods such as chemical vapor deposition, the two lattices would not be matched. That is, it is desirable to have the interface between the two materials preserve the crystalline structure of the materials, so that the first lattice is a smooth continuation of the second lattice, except that more arsenic atoms and fewer antimony atoms are now found on the Group V sites. This can not be achieved by conventional methods, but is readily achieved in superlattice structures by MBE. MBE also promises other unique capabilities, such as epitaxial deposition of insulators over semiconductors, metals over insulators, etc.

However, attractive as these capabilities are for semiconductor device fabrication, MBE systems at present are primarily a laboratory tool rather than a production tool, simply because the throughput of MBE systems is slow. In part, the slow throughput of MBE systems is unavoidable, since it is difficult to achieve good quality deposited material if the deposition rates used are greater than several microns per hour. However, in large part this problem of slow throughput has been due to the difficulties of wafer handling.

Thus, it is an object of the present invention to provide an MBE system having reduced time requirements for wafer handling.

The prior art of MBE systems has used molybdenum substrate holders, with each wafer being soldered to the substrate holder. Due to the extremely high vacuums which are used for growth (typically in the neighborhood of 10-11 Torr), the materials requirements for anything which will be present in the vacuum chamber are extremely stringent. These requirements are especially stringent for items which are in contact with the wafer or are in close proximity to the wafer since contaminants released by these items are particularly likely to be transported to the growth front and be incorporated into the epitaxial layer.

It should be noted that the actual position of the wafer during MBE growth is downward facing. This is done because, even in an ultra high vacuum system, some particulates will inevitably be present, e.g. particulates which adhere to the inner walls of the chamber until released by thermal cycling, accoustic vibrations, or minor mechanical shocks, and flaky arsenic particles from inadvertent arsenic deposition on the cryoshield. At extremely low pressures these particles will not be suspended in the chamber atmosphere, but will simply fall down to the bottom of the chamber. The wafer is positioned facing downward so that it does not intercept the path of any of these falling particulates, and to permit the wafer to face liquid sources such as a liquid gallium source.

It is also well known in the MBE art that the wafer should be rotated during growth. This provides more uniform deposition and heating. In particular, since an MBE system should have multiple molecular beam sources, to take advantage of the flexibility in deposition discussed above, the molecular beams from most of these sources will not impinge on the wafer at right angles to its surface. Essentially all of the depositions are angle depositions, and rotation of the wafer accordingly improves uniformity.

However, the combination of requirements just discussed adds up to a quite difficult mechanical problem in supporting the wafer during growth. Arc-cast molybdenum is an adequately high-purity material for the substrate holder, and can be machined into complex shapes as desired, but unfortunately the thermal expansion coefficient of molybdenum is very different from that of desirable substrate materials, such as gallium arsenide or other III-V semiconductor compounds. This means that the substrate must be held in such a manner that the substrate can expand freely during the temperature rise to the growth temperature, and not be strained by the different thermal expansion of the substrate holder.

The conventional method of the prior art to accomplish these objectives is indium soldering to a molybdenum substrate holder. That is, a very pure molybdenum substrate holder is used, which includes pins (or other mechanical elements) for attachment to the rotating drive in the growth chamber, and the substrate wafer upon which MBE is to be performed is hand-soldered to the substrate holder. That is, the substrate holder is heated to about 150° C. on a hot plate, and the wafer is manually placed upon it. At this temperature the indium will be liquid, but will freeze again to provide a good mechanical attachment as the wafer is cooled down. The wafer, mounted to a substrate holder, is then loaded into the MBE system. After initial pump down stages as will be discussed below, the wafer and substrate holder are eventually transferred into the growth chamber. In the growth chamber, the wafer is held in a downward-facing position, and heated up to the growth temperature. As the wafer temperature increases above the melting point of indium (about 142° C.), the indium melts, but the wafer is still held in position by the good adhesive properties of the liquid indium. After the growth run is complete, the substrate holder is allowed to cool, so that the indium refreezes and the substrate holder and wafer are then transferred back out of the growth chamber. After the wafer is removed from the MBE system, it is necessary to unsolder it from the substrate holder. This is a very delicate manual step. The same viscosity and adhesion which permit indium to hold the wafer in place during the growth cycle make removal of the wafer from the substrate holder difficult. A further difficulty is that the indium distribution will typically change during growth, especially if the molybdenum holder has been used many times, so that the thickness of the indium will often be found to be thicker under the edges of the wafer than under the center of the wafer. After the wafer is removed from the substrate holder, it will typically be found that the indium has partially alloyed with the backside of the GaAs wafer. To avoid producing crystal dislocations the alloyed material must be removed. This is typically done by etching in HCe. To avoid introduction of mobile impurities into the front surface of the wafer during this backside etch, the front surface is typically painted with photoresist prior to this etching step. (Likewise, the indium on the front side of the molybdenum substrate holder can be removed by etching the block in HCl.) However, repeated use of this cleanup etch will gradually erode the molybdenum so that the surface of the substrate holder is no longer planar.

After the indium is etched away, the backside of the wafer is no longer flat. If the wafer is sought to be processed in this condition, very many wafers will be broken during routine handling, since the etched backside will now contain irregularities which can produce local stress maxima. Moreover, use of vacuum chucks in subsequent wafer processing operations now becomes impractical, because the backside of the wafer is no longer flat.

This difficulty can be mitigated by repolishing the backside of the wafer until it is flat again. However, this provides a further manual processing step, in which further wafer breakage is inherently likely. Moreover, if the wafers are not initially of extra thickness, this polishing step will thin them so that they are very fragile and again liable to breakage in routine handling.

Moreover, the front side of the wafer, which now contains the expensive epitaxial layer, must be carefully protected from this further polishing step. A further difficulty with this prior art method is the smoothness of the molybdenum substrate holder. That is, the substrate holder as received (or as fabricated) will not be perfectly smooth, and the irregularities in the substrate holder surface may themselves make removal of the wafer more difficult. This problem can be avoided by polishing the molybdenum substrate holder, but the problem with this is that repeated polishing of the substrate holder will erode it.

All of these extra processing steps, required by the indium soldering, are very expensive. In particular, any processing step which risks slice breakage after the MBE operation has been performed is extremely expensive, since the structure which is thus exposed to a risk of being destroyed may be a structure which has just taken several hours of growth time on a million dollar machine, plus the initial slice cost and the pre-growth slice preparation cost.

Luscher, U.S. Pat. No. 4,201,152, contains a general description of MBE substrate holder manipulation, including transfer of a holder from a movable carriage to a treating station where deposition occurs. The patented invention relates to the contacts of the thermocouple monitoring the temperature of the holder, and no description of the mounting of the substrate on the holder is given. Rather, Luscher notes in passing that the substrate to be coated by the MBE process is mounted on the face of the holder in a known manner.

Salt, Jr., U.S. Pat. No. 4,344,383, illustrates retainer ring springs and complementary substrate holder recesses for holding substrates in the form of circular wafers during low pressure deposition processing. The wafers are simply inserted into the recesses and the retainer ring springs compressed, inserted into the recesses on top of and in contact with the wafers, and released to engage the recess sidewalls. The springs are still under slight compression and therefore do not slip on the sidewalls; further, the sidewalls may be tapered to help prevent slippage of the springs on the sidewalls.

It is an object of the present invention to provide an MBE system having a wafer support structure such that the number of handling steps required after growth is minimized.

It is a further object of the present invention to provide an MBE system wherein no unsoldering step is necessary after the growth step.

To achieve these and other objects, the present invention provides an MBE System wherein the wafer on which epitaxial deposition is to occur is not soldered to a substrate holder. Instead, a substrate holder with a lip approximately as high as the thickness of the wafer is used, and a retaining ring attaches to the substrate holder to hold the wafer in place during the growth cycle. The retaining ring, like the substrate holder, is made of high-purity refractory material, such as arccast molybdenum. The substrate holder and retaining ring are dimensioned to hold the wafer somewhat loosely, to allow for thermal expansion during the cycling up to growth temperature, which is typically about 600° C.

According to the present invention there is provided:

A molecular beam epitaxy system, comprising:

A growth chamber containing a plurality of effusion sources and a substrate support;

means for evacuating said growth chamber to provide an ultrahigh vacuum therein;

a substrate holder and retaining ring, said substrate holder and retaining ring being mutually attachable and dimensioned to hold a wafer of predetermined size there between, said substrate holder being attachable to a substrate support within said growth chamber; and means for transferring wafers in and out of said growth chamber.

According to the present invention there is provided:

A substrate holder assembly comprising:

a substrate holder and retaining ring, said substrate holder and retaining ring being dimensioned to hold a wafer of predetermined size therebetween, said substrate holder comprising means for attaching said substrate holder to a downward-facing substrate support;

wherein said substrate holder and said retaining ring are mutually attachable and define a cavity therebetween which is slightly larger than said wafer.

BRIEF DESCRIPTION OF THE DRAWINGS

The present invention will be described with reference to the accompanying drawings, which are hereby incorporated by reference, wherein.

DESCRIPTION OF THE PREFERRED EMBODIMENTS

As discussed above, the present invention teaches a molecular beam epitaxy (MBE) system having several novel features. The general configuration of the MBE system will first be discussed, and then the various novel features, with their alternative embodiments, will separately be discussed.

Figure 1:
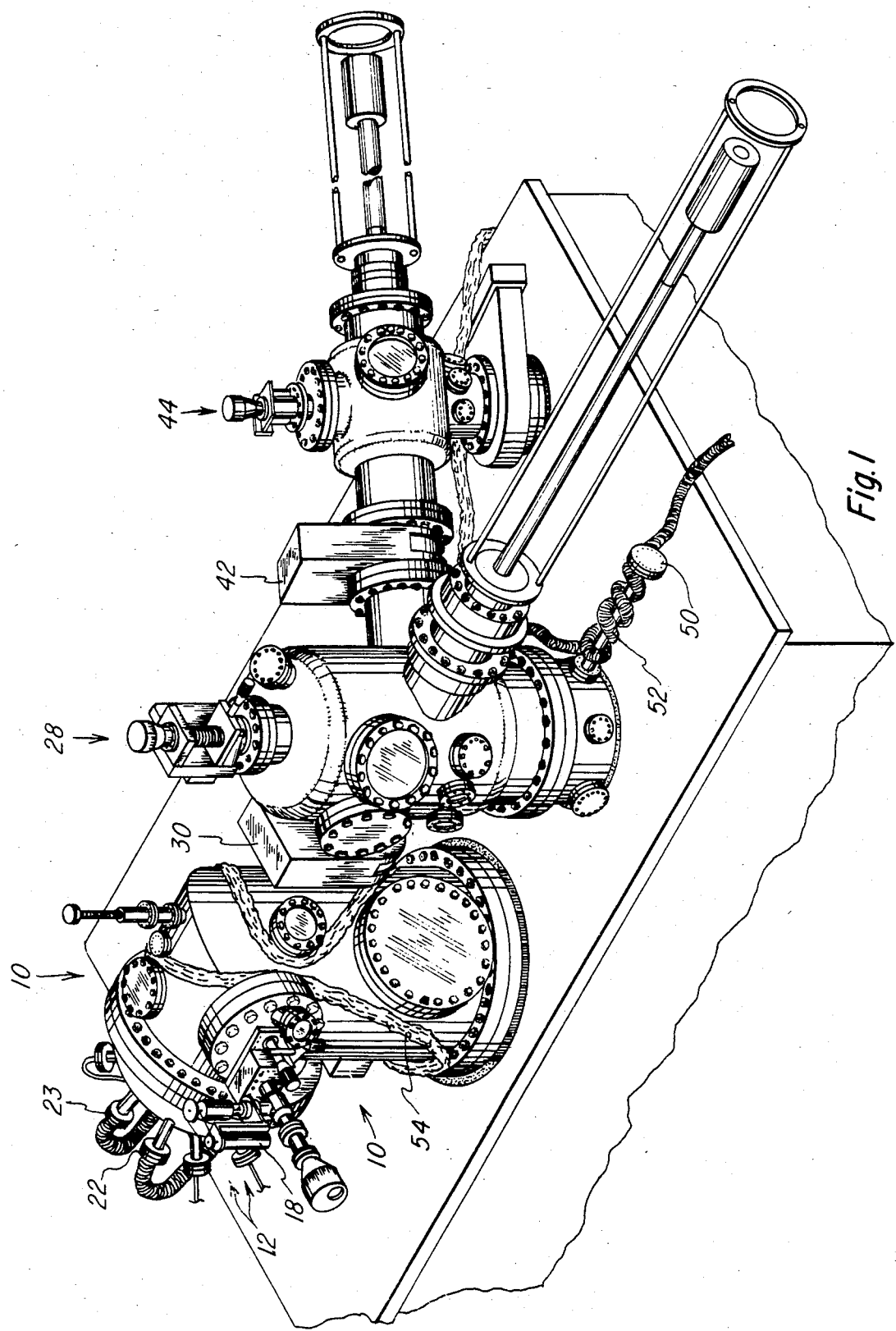
FIG. 1 shows a sample MBE system embodying the present invention.

FIG. 1 shows generally an MBE system which may embody the present invention. The system, in this embodiment, consists of three separate vacuum chambers, with valves interconnecting them. A growth chamber 10 is the vacuum chamber in which actual thinfilm deposition occurs. Mounted on this chamber are a plurality of sources 12, (effusion cells of Knudsen type). Each source 12 normally includes a shutter, so that, to deposit a selected species or combination of species, the operator can supply drive current to the resistive heating elements in the desired sources 12 and unshutter them to provide molecular beams under ultra high vacuum conditions. A substrate holder 14 is positioned downwardly facing and generally facing these sources 12, so that when the sources 12 emit molecular beams they will impinge on the substrate holder and can be incorporated in film growth. The substrate holder 14 normally incorporates a resistive heating element, and is connected to a rotary drive 18 so that the substrate holder 14 can be continuously rotated during the growth process, to promote more uniform growth. The inside of the growth chamber 10 is lined with a cryo shield, which includes plumbing connected to external liquid nitrogen supply and exhaust parts 22 and 23. During growth, the cryo shield is cooled to approximately 77 degrees K, to reduce background contaminants during growth.

The rotating substate support 14 normally remains in the chamber. However, a substrate holder 24 can be mounted and dismounted from a substrate support 14 under vacuum. This substrate holder 24 will typically have a wafer 26 attached to it.

The growth chamber 10 is separated from an analysis chamber 28 by a valve 30. The valve 30 must be capable of withstanding ultra-high vacuum without leakage to the outside world. Note that the valve 30 is preferably not placed where it can see the sources 12, to avoid plating excessive amounts of the molecular beam species onto the valve. Alternatively, a shutter could be placed in front of the valve.

A first transfer arm 32 is aligned with the valve 30, so that the first transfer arm 32 can transfer a wafer 26 and a substrate holder 24 from the growth chamber 10 from the analysis chamber 28 and back. The analysis chamber 28 will typically include analysis equipment so the condition of the grown film can be inspected without exposing it to atmospheric contamination. The analysis equipment may typically include instruments such as Auger analyzer, ESCA (electron spectroscopy for chemical analysis) analyzer, SIMS, etc.

The growth chamber 10 is equipped with its own high vacuum pump (e.g. an ion pump), and the analysis chamber 28 has its own high vacuum pump 38. Similarly, the preparation chamber 44 has its own vacuum pump 40. The growth chamber and analysis chamber will typically both be operated at pressures in the neighborhood of 1E-11 Torr, whereas the preparation chamber, which is frequently opened to the atmosphere, is normally operated at temperatures only around 1E-8 Torr.

A second valve 42, similar to the valve 30, connects the analysis chamber 28 to the preparation chamber 44, and a second transfer arm 46 is positioned in line with the valve 42 to transfer wafers and substrate holders from the preparation chamber 44 into the analysis chamber 28. The vacuum feedthrough for the second transfer arm 46 is essentially the same as that for the first transfer arm 32.

The sequence of operations involved in wafer transfer are described in detail. It will be recognized by those skilled in the art that this description particularly relates to an MBE system originally manufactured by Riber, but the invention is also applicable to many other MBE systems, and this particular system's operation is described, as being in the presently preferred best mode, in the greatest possible detail.

While the valve 42 is closed, the preparation chamber 44 is opened to the atmosphere, and 3 wafers, each assembled to a substrate holder and retaining ring, are loaded into the preparation chamber. One substrate holder is affixed to the slots on the end of the second transfer arm 46, which are positioned to engage the pins around the circumference of the substrate holder, and the other 2 substrate holders are similarly engaged by slots in the first wafer carrier 45. The preparation chamber 44 is then closed, and a rounting pump then brings it down to an initial low pressure. The preparation chamber 44 is then connected to ion pump 40, and brought down to a reasonable vacuum, e.g. 1E-8 Torr. Preferably one of the positions on the wafer mount 45 is provided with a heater, so that a wafer can be outgassed at low temperature (e.g. 200° C.) to minimize contamination of the high vacuum chambers. After a first wafer has been outgassed in the preparation chamber 44, the valve 42 is opened, and second transfer arm 46 transfers the wafer it is holding to the second wafer carrier 29 in the analysis chamber 28. This second transfer arm 46 is then retracted, the wafer carrier 45 is rotated so that the wafer which has just been outgassed is facing the transfer arm 46, the transfer arm 46 engages the substrate holder around this wafer, the wafer carrier 45 is rotated again so that the transfer arm 46 can pass through, and the transfer arm 46 again reaches into the analyzes chamber to place this outgassed wafer onto the second wafer carrier 29. The second transfer arm is then retracted, and the valve 42 is closed. The second transfer arm 46 now loads another wafer onto the heated position of the wafer carrier 45 for outgassing. Meanwhile, depending on the substrate used, an ion bombardment step may now be performed in the analysis chamber 28 to clean the surface of the wafer for growth. However, this is not necessary with gallium arsenide. The second wafer carrier 29 is then rotated so that the wafer to be grown faces the first transfer arm 32, and the first transfer arm 32 is extended and rotated to pick up the wafer next to be grown. The second wafer carrier 29 is rotated so that the first transfer arm 32 can pass through it, and the valve 30 is then opened so that the first transfer arm can reach into the growth chamber. The substrate support is now rotated so that it faces the first transfer arm, and the first transfer arm is extended into the growth chamber where it attaches the growth wafer by a rotary motion to the substrate support. (During all of this time, the cryo shield will be supplied with liquid nitrogen, so that its temperature is approximately 77 K.) The first transfer arm 32 will then be retracted and the valve 30 closed, and preparations for growth can begin. That is, the substrate support will now be rotated into the growth position, which in the presently preferred embodiment faces downward along an axis approximately 22½ degrees from horizontal. Initially, for a gallium arsenide wafer, the arsenic source will be powered to provided a background arsenic pressure of about 1E-5 Torr of arsenic in the growth chamber. While this arsenic overpressure is maintained, the heating filament in the substrate support will very briefly be powered sufficiently to run the wafer up to a temperature of about 630° C. This outgasses the wafer, i.e. causes the native oxides of gallium to sublime from the wafer surface. This step is performed only very briefly, to avoid excessive arsenic loss from the wafer surface. The wafer is then returned to a steady state growth temperature, of 600° C. in this example, and the desired sources for epitaxial growth are powered up and unshuttered. After the desired growth has been achieved, the arsenic cell only is left open, to again provide an arsenic overpressure of about 1E-5 Torr, while the wafer cools. After the wafer is cooled, the arsenic source is shuttered, and the above sequence of wafer transfers is repeated in reverse.

The end of such a sequence of operations is a set of 3 wafers, each still mounted between a substrate holder and a retaining ring and each having an epitaxial layer thereon, in the preparation chamber 44. Preparation chamber 44 is then opened to atmosphere, the grown wafers are removed, and new wafers, each in a substrate holder and a retaining ring, are mounted.

During the growth operation, as is well known to those skilled in the art, the wafer is heated to a temperature (e.g. 600° C.) sufficient to provide surface mobility for the as-deposited atoms for them to seek out their energetically favorable lattice positions, thus assuring good lattice quality. The temperature of the wafer 26 during growth must be carefully monitored. This can be done in at least 2 ways. In the presently preferred embodiment, an optical pyrometer 48 is used. This instrument looks through a view port in the wall of the growth chamber 10 so that it can see the wafer 26 during growth. Preferably the viewport is shuttered most of time, to eliminate the deposition of reflective films on the viewport. Alternatively, a thermocouple can be mounted on substrate 14 in close proximity to the backside of substrate holder 24. To heat the wafer during growth, a resistive heating element is also incorporated in the substrate support 14, close to the backside of the substrate holder 24. In fact, the substrate holder 24 is preferably made quite thin, to maximize the thermal coupling between the wafer 26 and the heating element.

The foregoing has described one growth operation in the operation of the MBE system. This description has assumed that the growth chamber 10 is kept in ultra high vacuum all the time. However, the equipment is of course received at atmospheric pressure, and must periodically be restored to atmospheric pressure for maintenance operations, mounting of new sources, etc. After the growth chamber 10 has been exposed to atmospheric or near atmospheric pressure, some sort of bakeout operation is necessary before it can reach ultrahigh vacuum. That is, the walls of the growth chamber will include a substantial mass of adsorbed water, hydrocarbons, and other volatile contaminants, and if an attempt is made to simply pump the chamber down to ultrahigh vacuum levels, these contaminants will gradually desorb from the walls, so that the pumping operation will take a tremendously long time and will never achieve a good vacuum. Thus, to remove these volatile species (mostly water vapor, and hydrocarbon), an initial bakeout is necessary. This is normally performed by enclosing the growth chamber 10 with a bake out oven, i.e. a heat shield incorporating radiant heaters, which can heat the whole growth chamber 10 to about 200° C. During this operation, it is of course necessary to disconnect the cryogenic gas connections, and also, to fit the furnace in place, it is normally necessary to disconnect other elements, including other electrical and plumbing connections.

Figure 2:
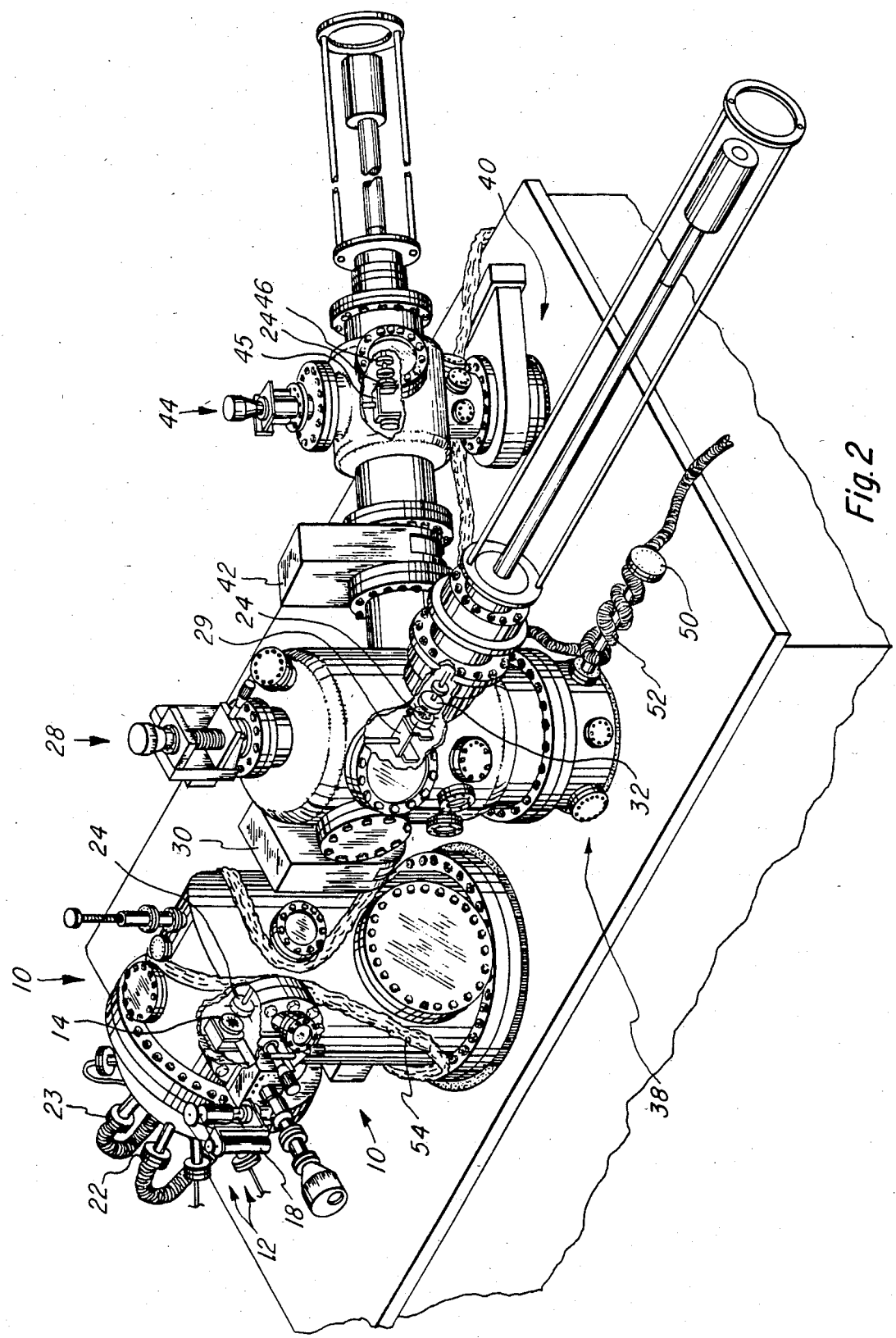
FIG. 2 in a cutaway view of FIG. 1, showing further details of wafer transport mechanisms.

The novel substrate holder structure taught by the present invention will now be discussed in greater detail. FIG. 2 shows the attachment of a wafer 26 and substrate holder 24 to the substrate support 14. This structure is located inside the growth chamber 10, and is attached to the wafer drive 18. The substrate holder of the prior art (not illustrated) uses a holder of high-purity molybdenum, which has pins attached to its periphery. The pins provide the attachment for the substrate support 14. These pins are held by forks driven by the wafer drive 18, to rotate the substrate during growth. As discussed above, the prior art method of attaching the wafer 26 to the substrate holder is by indium soldering.

However, in the present invention the substrate holder is given a different structure, which permits a different attachment method.

Figure 3:
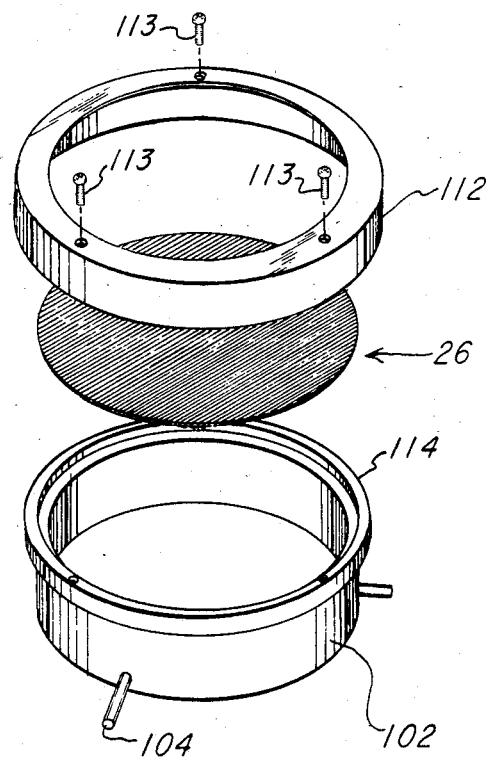
FIG. 3 shows a variation of the first preferred embodiment.
Figure 4:
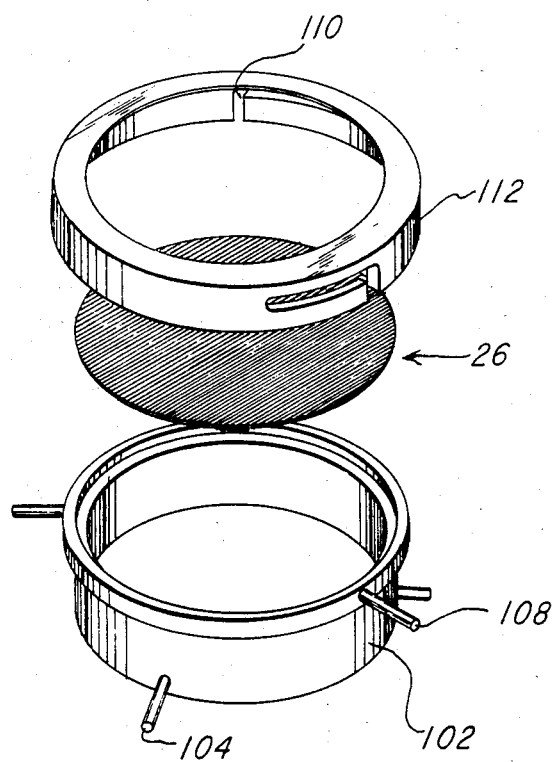
FIG. 4 shows the substrate holder and retaining ring used in the presently first preferred embodiment of the invention.

As seen in FIG. 4, the novel substrate holder 102' still has pins 104 which are driven by the forks of the substrate support 14, but the substrate holder 102' also has additional pins 108. These additional pins 108 engage slots 110 in a retainer ring 112. As seen in FIG. 4, the slots 110 in the retainer ring 112 engage the pins 108 on a substrate holder 102', so that the wafer is held there between. Note that the substrate holder 102' has raised lip 114 on its face, so that the wafer 26 is held slightly loosely between the substrate holder 102' and the retainer ring 112. It is necessary that a percent or two of extra space be present in these dimensions, to allow for thermal mismatch. That is, as discussed above, the thermal expansion coefficients of III-V materials and of molybdenum are very different, so that a tight fit would cause warpage of the wafer. However, the fit must not be excessively loose, or the wafer will flop around and provide uneven growth characteristics. Another alternative to soldering is attachment of ring 112 to holder 102' by screws 113, as shown in FIG. 3.

In one embodiment of the present invention, of the substrate holder 102' is provided with a thin back, for good thermal coupling of the wafer 26 to the resistive heater in the substrate support 14. Optionally, a boss is provided centered in the back of the substrate holder, so that a thermocouple located in the substrate support 14 can accurately sense the temperature of the substrate holder 102 and therefore of the wafer 26. However, this boss may be omitted if an optical pyrometer is used to sense the temperature of the wafer during growth, as is presently preferred.

In the presently preferred, alternative embodiment of the present invention, the substrate holder itself has no back. As shown in FIG. 4, this configuration still provides good mechanical support for the wafer 26. This arrangement provides even better thermal coupling of the wafer 26 to the resistive heating element.

Figure 5A:
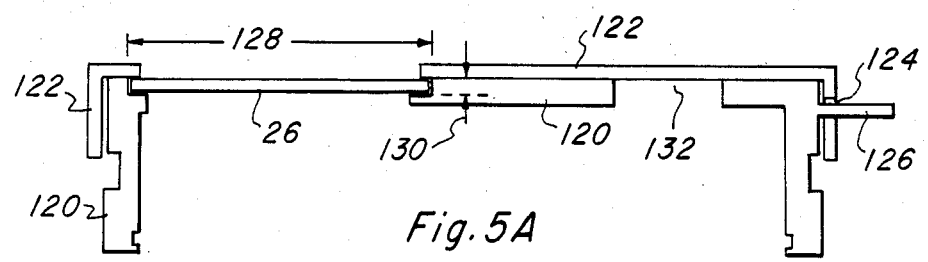
FIGS. 5A-C show a second preferred embodiment in cross sectional, plane, and detailed views, respectively.
Figure 5B:
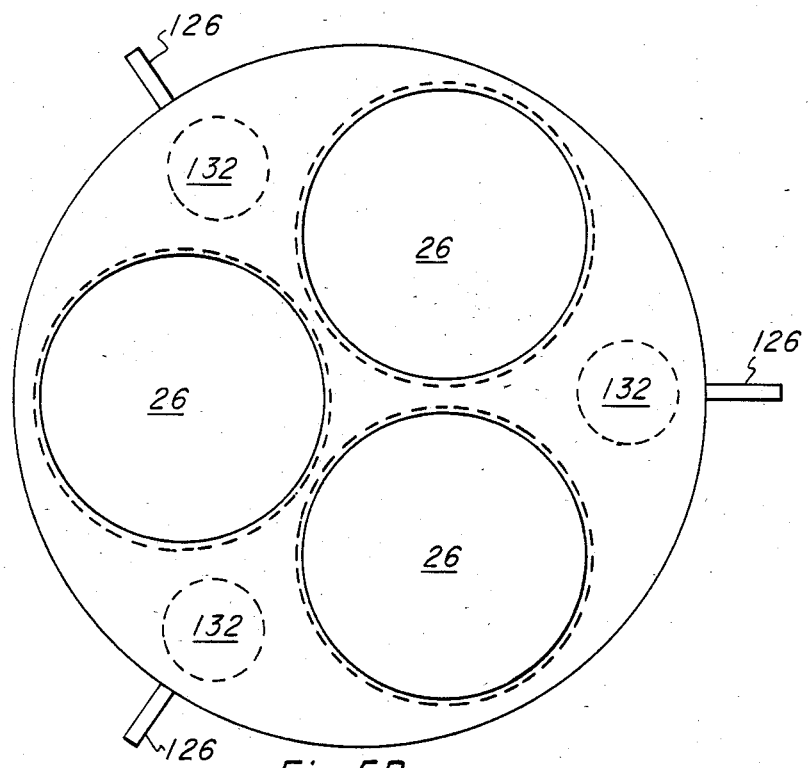
Figure 5C:
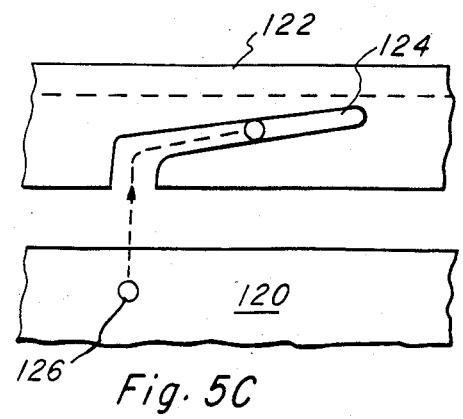

FIGS. 5A-C show further preferred embodiment substrate holder 120 and retainer ring 122 in cross sectional, plan and detail views, respectively. As with holder 102' and retainer ring 112, holder 120 and retainer ring 122 hold circular wafers 26 in cavities formed between holder 120 and retainer ring 122 when slots 124 in retainer ring 122 engage pins 126 on holder 120. Holder 120 and retainer ring 122 provide three cavities for three wafers 26 to be simultaneously processed. For 1.5 inch diameter wafers 26, holder 120 and retainer ring 122 are about 3.5 inches in diameter and cavity diameter 128 (see FIG. 5A) is about 1.52 inches; the 0.02 inch oversize of the cavity compensates for a greater coefficient of thermal expansion of wafer 26 than of holder 120 and retainer ring 122. Recall that typically wafer 26 is gallium arsenide and holder 120 and retainer ring 122 are molybdenum and that MBE deposition is typically at 600°-650 degrees C., thus wafer 26 will not be tightly held but also will not be loose in the cavity at deposition temperatures. Also, wafer 26 typically is 25 mils thick, so cavity depth 130 is 28 mils; again, this slight oversize allows for differing thermal expansion but not to the extent of looseness of wafers 26 in the cavities. Any tightness or binding of wafers 26 in the cavities could lead to defects in the water, and, further, the not binding nature of the retention of wafers 26 in the cavities lends itself to automated loading and unloading of wafers onto and off of holder 120 in high vacuum.

As illustrated in FIG. 5C, slot 124 is inclined so that retainer ring 122 is pressed against holder 120 as pins 126 engage slots 124 and retainer ring 122 rotates into position. Of course, the dimensions of holder 120, retainer ring 122, and the cavities could be increased to accommodate 3.0 inch diameter wafers; holder 120 would be about 7.0 inches in diameter. Similarly, thicker or thinner wafers could be accommodated by simply changing the depths of one or more of the cavities.

Lastly, holder 120 has holes 132 which permit heat from the resistive heater 16 in the substrate support 14 to directly heat retainer ring 122 and insure good thermal uniformity.

The ability of holder 120 and retainer ring 122 to hold three wafers simultaneously permits differently prepared wafers (either different bulk properties such as undoped, chromium doped, silicon doped, etc. or different surface properties such as various circuit elements or both) to be identically MBE deposited for comparison of subsequent device performance.

As will be appreciated by those skilled in the art, the present invention can be practiced in a wide variety of modifications and variations, and is accordingly not limited except as specified in the accompanying Claims.

What is claimed is:

1. A molecular beam epitaxy system, comprising:
   (a) a growth chamber containing a plurality of effusion sources and a substrate support;
   (b) means for evacuating said growth chamber to provide an ultrahigh vacuum therein;
   (c) a substrate holder and retaining ring, said substrate holder and retaining ring being mutually inflexibly attachable and dimensioned to hold slightly loosely in all directions one or more wafers of predetermined size therebetween, said substrate holder being attachable to a substrate support within said growth chamber; and
   (d) means for transferring wafers in and out of said growth chamber
   (e) wherein said substrate holder comprises a first set of pins around the circumference thereof, and wherein said substrate support comprises slots positioned to mate with said pins and said substrate holder to retain said substrate holder in contact with said substrate support in a downward facing position.

2. The system of claim 1, wherein said substrate holder further comprises a second set of pins and said retaining ring comprises slots positioned to mate with said second set 3. The system of claim 1, wherein said retaining ring and said substrate holder define a cavity therebetween, said cavity having dimensions slightly larger then said wafer.

4. A substrate holder assembly, comprising:
   (a) a substrate holder and retaining ring, said substrate holder and retaining ring being dimensioned to hold slightly loosely in all directions one or more wafers of predetermined size therebetween, said substrate holder comprising means for attaching said substrate holder to a downward-facing substrate support;
   (b) wherein said substrate holder and said retaining ring are mutually inflexibily attachable and define one or more cavities therebetween which are slightly larger than said wafer; and
   (c) wherein said substrate holder comprises a first set of pins around the circumference thereof, and wherein said substrate support comprises slots positioned to mate with said pins and said substrate holder to retain said substrate holder in contact with said substrate support in a downward facating position.

5. The assembly of claim 4, wherein said substrate holder further comprises a second set of pins and said retaining ring comprises slots positioned to mate with said second set of pins to retain said wafer between said retaining ring and said substrate holder.

* * * * *